(12) United States Patent
Takagi et al.

(10) Patent No.: US 11,508,780 B2
(45) Date of Patent: Nov. 22, 2022

(54) METHOD OF MANUFACTURING DISPLAY APPARATUS, DISPLAY APPARATUS, AND STRUCTURE FOR MANUFACTURING DISPLAY APPARATUS

(71) Applicant: SAMSUNG ELECTRONICS CO., LTD., Suwon-si (KR)

(72) Inventors: Takashi Takagi, Yokohama (JP); Masaru Wada, Yokohama (JP); Satoshi Yanagisawa, Yokohama (JP); Tsubasa Fujiwara, Yokohama (JP)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 154 days.

(21) Appl. No.: 16/926,169

(22) Filed: Jul. 10, 2020

(65) Prior Publication Data

US 2021/0217804 A1 Jul. 15, 2021

(30) Foreign Application Priority Data

Jan. 14, 2020 (JP) .............................. JP2020-003723
Feb. 26, 2020 (KR) ........................ 10-2020-0023837

(51) Int. Cl.
*H01L 27/15* (2006.01)
*G09F 9/33* (2006.01)

(52) U.S. Cl.
CPC .............. *H01L 27/156* (2013.01); *G09F 9/33* (2013.01)

(58) Field of Classification Search
None
See application file for complete search history.

(56) References Cited

U.S. PATENT DOCUMENTS

| 10,283,684 B2 | 5/2019 | Lin et al. |
| 10,355,166 B2 | 7/2019 | Jeung et al. |
| 10,872,828 B2 | 12/2020 | Ahn et al. |
| 2017/0018525 A1 | 1/2017 | Dias et al. |
| 2017/0140961 A1 | 5/2017 | Sasaki et al. |
| 2018/0374738 A1* | 12/2018 | Lee .................. H01L 33/0095 |
| 2019/0304854 A1 | 10/2019 | Ahn et al. |
| 2020/0219855 A1* | 7/2020 | Chen .................. H01L 21/6835 |

(Continued)

FOREIGN PATENT DOCUMENTS

| KR | 101890934 B1 | 8/2018 |
| KR | 10-2018-0127045 A | 11/2018 |
| KR | 101918106 B1 | 11/2018 |

(Continued)

OTHER PUBLICATIONS

International Search Report and Written Opinion (PCT/ISA/210 and PCT/ISA/237), dated Nov. 10, 2020 by International Searching Authority in International Application No. PCT/KR2020/009530.

*Primary Examiner* — Robert K Carpenter
(74) *Attorney, Agent, or Firm* — Sughrue Mion, PLLC

(57) ABSTRACT

A method of manufacturing a display apparatus, a display apparatus, and a structure for manufacturing a display apparatus are provided. The method of manufacturing a display apparatus includes: forming a micro-light-emitting diode (LED) chip on a relay substrate such that a chip-side electrode is exposed; transferring the micro-LED chip from the relay substrate to a driving substrate including a driving substrate-side electrode; and bonding the chip-side electrode to the driving substrate-side electrode.

13 Claims, 12 Drawing Sheets

(56) References Cited

U.S. PATENT DOCUMENTS

2020/0403123 A1    12/2020  Jang et al.

FOREIGN PATENT DOCUMENTS

| KR | 101953645 B1    | 3/2019  |
|----|-----------------|---------|
| KR | 101937036 B1    | 4/2019  |
| KR | 10-2019-0081364 A | 7/2019 |
| KR | 10-2019-0096256 A | 8/2019 |
| KR | 10-2019-0114334 A | 10/2019 |
| WO | 2019/172594 A1  | 9/2019  |

* cited by examiner

METHOD OF MANUFACTURING DISPLAY APPARATUS, DISPLAY APPARATUS, AND STRUCTURE FOR MANUFACTURING DISPLAY APPARATUS

CROSS-REFERENCE TO RELATED APPLICATION(S)

This application claims the benefit of Japanese Patent Application No. 2020-003723, filed on Jan. 14, 2020, in the Japanese Patent Office and Korean Patent Application No. 10-2020-0023837, filed on Feb. 26, 2020, in the Korean Intellectual Property Office, the disclosures of which are incorporated herein by reference in their entireties.

BACKGROUND

1. Field

The disclosure relates to a method of manufacturing a display apparatus, a display apparatus, and a structure for manufacturing a display apparatus.

2. Description of Related Art

Recently, display apparatuses using micro-light-emitting diodes (LEDs) as light-emitting devices have been in the spotlight. Micro-LED display apparatuses (hereinafter, referred to as "display apparatuses") are next-generation display apparatuses that are capable of displaying high-luminance and high-quality images at low power without causing a decrease in response speed. In display apparatus manufacturing techniques of a related art, micro-LED chips are bonded onto a driving substrate at a certain arrangement pitch, and then are inspected for a defective chip. When a defective chip is found as a result of the inspection, the defective chip is separated from the driving substrate, and then a good-quality chip is bonded to replace the defective chip in the driving substrate.

However, a chip bonded to the driving substrate is firmly bonded to the driving substrate by soldering, and thus, the chip may not be easily removed from the driving substrate. Because the micro-LED chip is very small ranging in a size of 100 μm or less, even when only the defective chip is intended to be removed from the driving substrate, a normal chip around the defective chip may also be damaged.

SUMMARY

According to an embodiment of the disclosure, provided is a method of manufacturing a display apparatus in which a defective chip may be easily exchanged.

According to an embodiment of the disclosure, provided is a display apparatus in which a defective chip may be easily exchanged.

According to an embodiment of the disclosure, provided is a structure for manufacturing a display apparatus in which a defective chip is easily exchanged.

Additional aspects will be set forth in part in the description which follows and, in part, will be apparent from the description, or may be learned by practice of the embodiments of the disclosure herein.

According to an embodiment, there is provided a method of manufacturing a display apparatus including a plurality of micro-light-emitting diode (LED) chips each comprising a chip-side electrode, the method including: forming the plurality of micro-LED chips on a relay substrate such that the chip-side electrode is exposed; transferring the plurality of micro-LED chips from the relay substrate to a driving substrate comprising a driving substrate-side electrode; and bonding the chip-side electrode to the driving substrate-side electrode.

The forming the plurality of micro-LED chips on the relay substrate further includes attaching the plurality of micro-LED chips with a resin material formed on the relay substrate.

The resin material may include silicone resin.

The method may further include, after the forming of the plurality of micro-LED chips, applying a current to the chip-side electrode of each of the plurality of micro-LED chips formed on the relay substrate to detect a defective chip, and storing a location of the defective chip.

The method may further include separating the defective chip from the relay substrate according to the location of the defective chip and attaching a new micro-LED chip to the location of the defective chip on the relay substrate, from which the defective chip is separated.

The method may further include: forming, on a substrate, a semiconductor layer on which the plurality of micro-LED chips are to be formed; forming the chip-side electrode on the semiconductor layer; dividing the semiconductor layer to be the plurality of micro-LED chips; and transferring the plurality of micro-LED chips to a support substrate.

The transferring the plurality of micro-LED chips may include arranging the plurality of micro-LED chips on the support substrate at a predetermined arrangement pitch while the chip-side electrode is facing the support substrate.

The forming the plurality of micro-LED chips may further include transferring the plurality of micro-LED chips on the support substrate to the relay substrate such that the chip-side electrode is exposed.

The bonding the chip-side electrode may further include: positioning the chip-side electrode and the driving substrate-side electrode to face each other, pressurizing the relay substrate and the driving substrate toward each other with a solder without flux being disposed between the chip-side electrode and the driving substrate-side electrode, and heating the chip-side electrode and the driving substrate-side electrode to a temperature lower than or equal to a solder melting temperature and compressing the chip-side electrode and the driving substrate-side electrode via the solder.

The method may further include: separating the relay substrate from the plurality of micro-LED chips; and heating the driving substrate onto which each of the plurality of micro-LED chips is compressed to a temperature equal to or higher than the solder melting temperature for reflow.

The method may further include, after the separating of the relay substrate, applying flux to a surface of the driving substrate on which the plurality of micro-LED chips are located.

At least one of eutectic metal between the solder and the chip-side electrode or eutectic metal between the solder and the driving substrate-side electrode is formed by the reflow.

The pressurizing and the heating may further include heating the solder to a temperature of 200° C. to 216° C., and pressurizing the relay substrate onto the driving substrate-side electrode with a pressurizing force of 0.5 MPa to 1.0 MPa.

The relay substrate may include a material transmitting greater than or equal to 50% of visible light.

According to an embodiment, there is provided a display apparatus including: a micro-light-emitting diode (LED) chip; a chip-side electrode provided on the micro-LED chip; a driving substrate on which the micro-LED chip is mounted; a driving substrate-side electrode provided on the driving substrate; and a metal material via which the chip-side electrode is bonded to the driving substrate-side electrode, where flux is not provided at at least one of an interface between the chip-side electrode and the metal material or an interface between the driving substrate-side electrode and the metal material.

The metal material includes at least one of eutectic metal between a solder and the chip-side electrode or eutectic metal between a solder and the driving substrate-side electrode.

Each of the chip-side electrode and the driving substrate-side electrode may include at least one metal selected from among copper, gold, and aluminum.

According to an embodiment, there is provided a structure for a display apparatus, for transferring a plurality of micro-light-emitting diode (LED) chips each having a chip-side electrode from a relay substrate to a driving substrate including a driving substrate-side electrode to bond the chip-side electrode to the driving substrate-side electrode, the structure including: the plurality of micro-LED chips; the relay substrate; and a resin material provided on the relay substrate, where the plurality of micro-LED chips are attached to the resin material with a certain arrangement pitch on the relay substrate, such that the chip-side electrode is exposed.

The relay substrate may include a material transmitting greater than or equal to 50% of visible light.

The resin material may include silicone resin.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
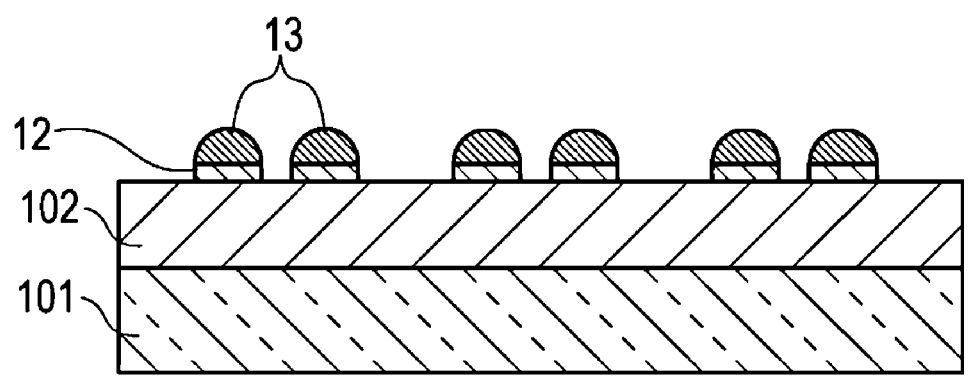
FIG. 1 is a schematic cross-sectional view for describing a formation of a micro-light-emitting diode (LED) according to an embodiment.

Hereinafter, the disclosure will be described with reference to the accompanying drawings, in which one or more embodiments of the disclosure are shown. The same reference numerals in the drawings denote the same elements, and sizes of elements in the drawings may be exaggerated for clarity and convenience of explanation. In addition, embodiments of the disclosure described hereinbelow are merely examples, and various modifications may be made from the embodiments of the disclosure.

Throughout the disclosure, the expression "at least one of a, b or c" indicates only a, only b, only c, both a and b, both a and c, both b and c, all of a, b, and c, or variations thereof.

It will be understood that when an element is referred to as being "above" or "on" another element, it may be directly on the other element, or intervening elements may be present therebetween. Likewise, it will also be understood that when an element is referred as being "under" or "below" another element, it may be directly under the other element, or intervening elements may be present therebetween.

An expression used in the singular encompasses the expression of the plural, unless it clearly indicates a different meaning in the context. It will be further understood that the term "comprise" or "include" used herein specify the presence of stated elements, but do not preclude the presence or addition of one or more other elements.

The use of the term "the" and similar referents is to be construed to cover both the singular and the plural.

Operations of a method may be performed in any suitable order unless the order is clearly indicated or described otherwise. The order is not limited to the described order of the operations. The use of any examples (e.g., "such as") provided herein is intended merely to better describe the embodiments and does not pose a limitation on the scope of the disclosure unless specifically indicated otherwise.

A method of manufacturing a display apparatus according an embodiment of the disclosure will now be described.

FIG. 1 is a schematic cross-sectional view for describing a method of manufacturing a display apparatus according to an embodiment.

Referring to FIG. 1, a semiconductor layer 102 including micro-light-emitting diode (LED) chips is formed on a substrate 101. The substrate 101 may be, for example, a sapphire substrate. However, the substrate 101 is not limited thereto and may be formed of various materials.

The semiconductor layer 102 may include an emission layer that emits light of a certain emission spectrum. According to an embodiment, micro-LED chips of three colors may be provided. The three colors may be, for example, red (R), green (G), and blue (B). Thus, in the current embodiment, the substrate 101 may be prepared for each color, and the semiconductor layer 102 having a different composition for each color may be formed on the substrate 101. In addition, there may be a plurality of semiconductor layers 102. The semiconductor layers 102 of the respective colors may have different compositions and structures.

An electrode is formed on the semiconductor layer 102 at a location corresponding to each micro-LED chip. Here, the electrode may be referred to as a chip-side electrode 12 (or a device-side electrode).

The chip-side electrode 12 may be formed to correspond to an arrangement pitch of chips arranged on a driving substrate 20 of FIG. 8 described below. For the chip-side electrode 12, a portion of a metal wire electrically connected to the semiconductor layer 102 may be used or may also form a metal pad that directly contacts the semiconductor layer 102.

The chip-side electrode 12 may be formed by using, for example, graphene or metal including at least one of gold (Au), silver (Ag), copper (Cu), aluminum (Al), platinum (Pt), nickel (Ni), chromium (Cr), titanium (Ti), or indium tin oxide (ITO). For example, the chip-side electrode 12 may be formed by including at least one selected from a group consisting of Au, Ag, and Cu.

In addition, a micro-bump by a solder 13 (or a metal material) may be formed on the chip-side electrode 12. For example, tin-silver-copper (SnAgCu, also referred to as SAC) may be used as the solder 13.

Figure 2:
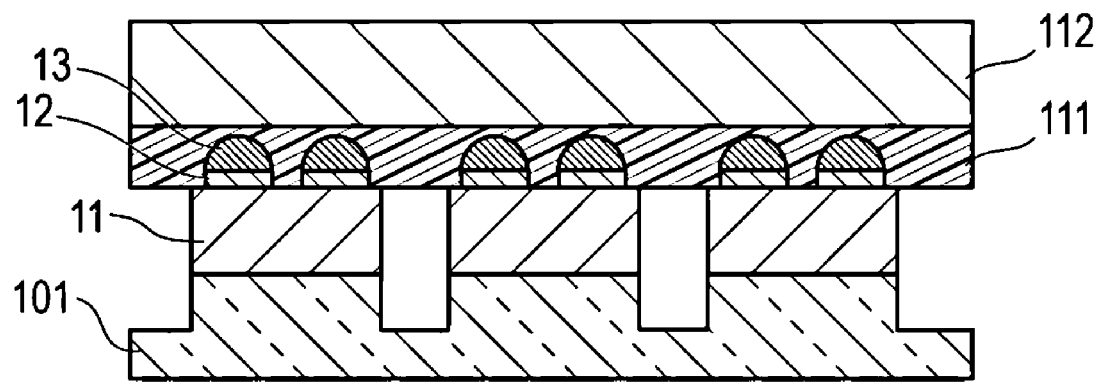
FIG. 2 is a schematic cross-sectional view illustrating a support substrate on which chips are held according to an embodiment.

Next, dicing into the micro-LED chips and transferring of the micro-LED chips to a support substrate may be performed (an operation of transferring to a support substrate). Referring to FIG. 2, in the operation of transferring to a support substrate, first, the semiconductor layer 102 is divided into micro-LED chips 11 (hereinafter, referred to as chips) with respect to the substrate 101 by using a dicing method. Here, the substrate 101 may be partially cut, rather than being completely separated.

Subsequently, with the substrate 101, the chips 11 may be attached to a support substrate 112. FIG. 2 is a schematic cross-sectional view illustrating the support substrate 112 on which the chips 11 are held.

As shown in FIG. 2, the chips 11 may be attached by a resin layer 111 such that a surface of each chip 11 on which each chip-side electrode 12 is formed faces the support substrate 112. In addition, although only chips 11 of one color are illustrated in FIG. 2, in embodiments of the disclosure, the support substrate 112 may be provided for each color in this operation and chips 11 of each color may be attached to each support substrate 112. In addition, the chips 11 of one color may be attached to the support substrate 112 one by one at a certain arrangement pitch. In this operation, the arrangement pitch may be a final arrangement pitch on the driving substrate 20 (see FIG. 9).

Figure 3A:
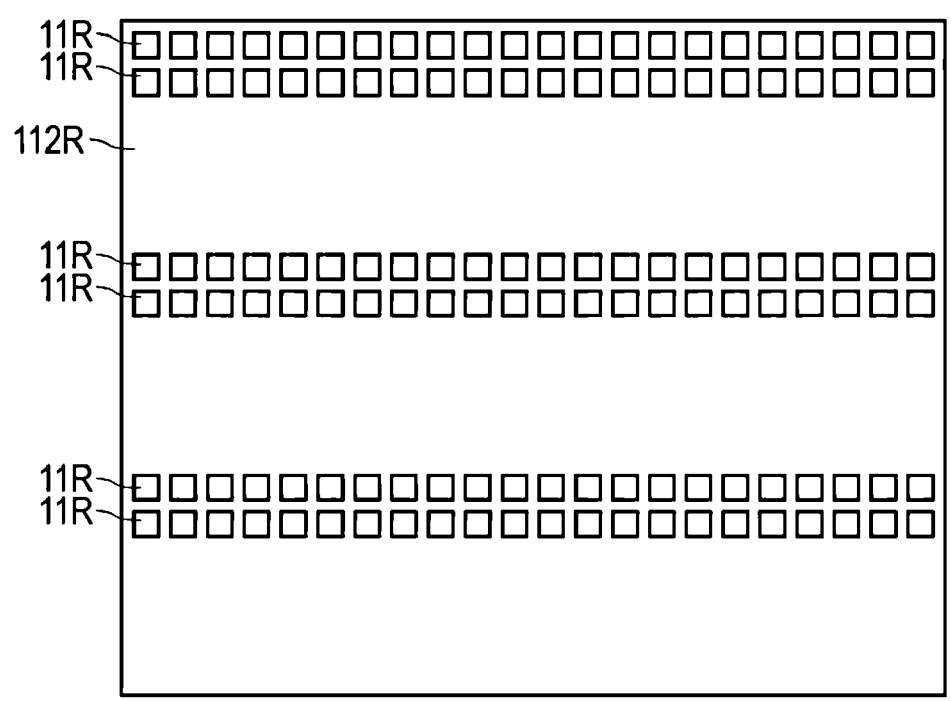
FIG. 3A is a plan view illustrating a support substrate where chips are provided for each color according to an embodiment.
Figure 3B:
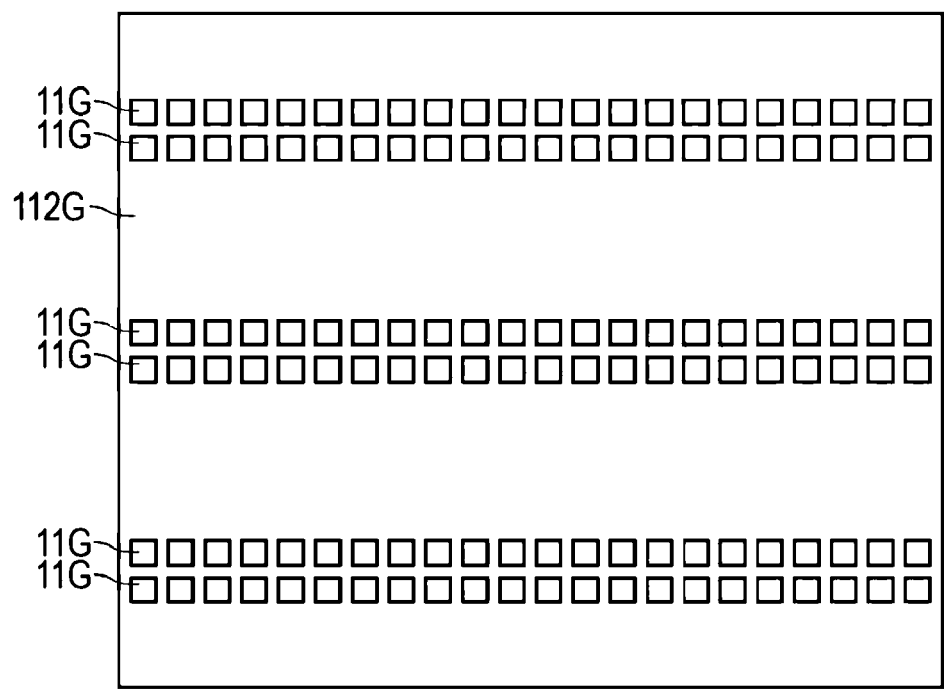
FIG. 3B is a plan view illustrating a support substrate where chips are provided for each color according to another embodiment.
Figure 3C:
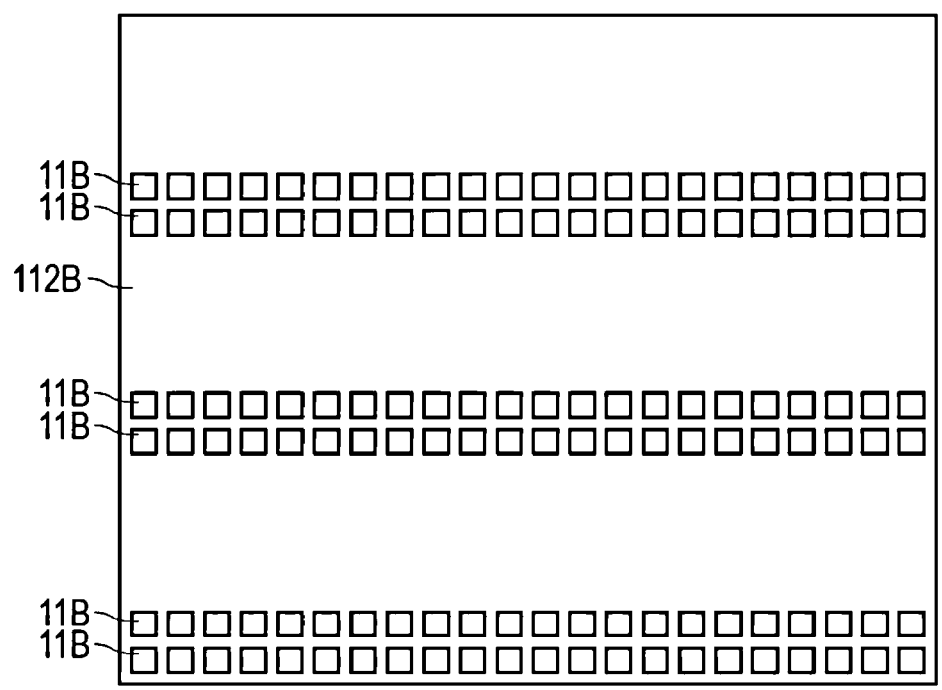
FIG. 3C is a plan view illustrating a support substrate where chips are provided for each color according to yet another embodiment.

FIGS. 3A, 3B and 3C are plan views illustrating support substrates where chips 11 are provided for each color. FIG. 3A illustrates a support substrate 112R including red light-emitting chips 11R, FIG. 3B illustrates a support substrate 112G including green light-emitting chips 11G, and FIG. 3C illustrates a support substrate 112B including blue light-emitting chips 11B.

As shown in FIG. 3A, the red light-emitting chips 11R may be arranged on the support substrate 112R for a red color at a certain arrangement pitch. The green light-emitting chips 11G may be arranged on the support substrate 112G for a green color at a certain arrangement pitch. The blue light-emitting chips 11B may be arranged on the support substrate 112B for a blue color at a certain arrangement pitch. In addition, in the embodiments of the disclosure, all descriptions are given without distinguishing one color from another. For example, an alkali-free glass substrate or a quartz glass substrate may be used as the support substrate 112. In addition, the resin layer 111 may include at least one selected from a group including, for example, polyimide resin, acrylic resin (e.g., polymethyl methacrylate (PMMA)), epoxy resin, polypropylene (PP) resin, polycarbonate resin, and acrylonitrile butadiene styrene (ABS) resin. When the resin is used, a thermosetting agent may be included. Alternatively, thermosetting resin may be used as the resin layer 111.

Figure 4:
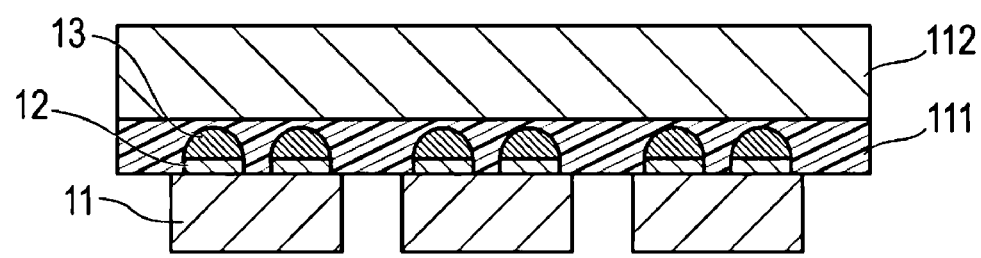
FIG. 4 is a schematic cross-sectional view illustrating a state in which a portion of a substrate is removed from chips on a support substrate according to an embodiment.

The substrate 101 may be separated and removed from the chips 11. FIG. 4 is a schematic cross-sectional view illustrating a state in which the substrate 101 is removed from the chips 11 supported on the support substrate 112 according to an embodiment.

The separation of the substrate 101 may be performed by using, for example, laser lift-off technique. A laser beam of an ultraviolet wavelength may be irradiated from a side of the substrate 101 so as to pass through the entire surface thereof. For example, KrF excimer laser of a wavelength of 248 nm may be used as the laser beam. However, the wavelength used is not limited thereto, and may be any wavelength capable of separating the substrate 101 from the semiconductor layer 102. As shown in FIG. 4, the substrate 101 may be separated and removed from the semiconductor layer 102 by irradiation of the laser beam.

The substrate 101 may be removed from the chips 11 such that the chips 11 may be formed as individual micro-LED chips. For example, each chip 11 (without a portion of the substrate 101) may have a three-dimensional shape such as a substantially rectangular parallelepiped shape or a substantially cubic shape, and may have a planar shape of a rectangle. A length of a side of the rectangle may be, for example, in a range of 1 μm to 100 μm. In addition, each chip 11 may have, for example, a cylindrical shape and a planar shape of a circle. A diameter of the circle may be, for example, in a range of 1 μm to 100 μm. A portion of the planar shape of the rectangle or the circle may be, for example, a light extraction surface of a micro LED. However, the shape of each chip 11 is not limited thereto, and each chip 11 may have a planar shape having substantially the same size or area as the rectangular or the circular shape described above.

Figure 5:
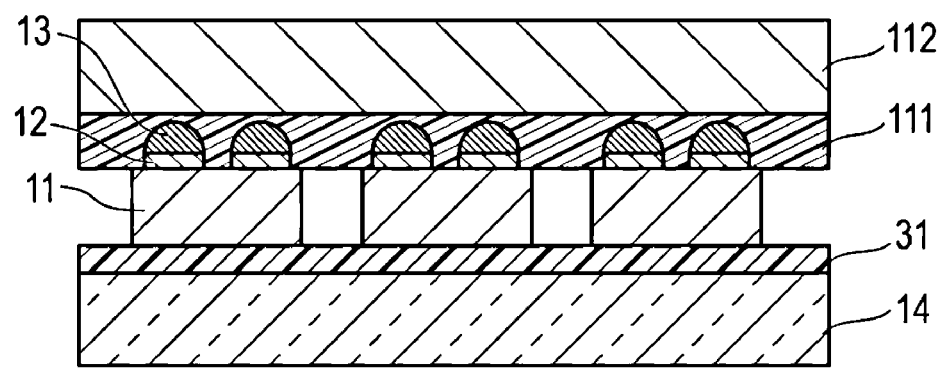
FIG. 5 is a schematic cross-sectional view for describing a process of transferring chips from a support substrate to a relay substrate according to an embodiment.

In this operation, each chip 11 is arranged such that each chip-side electrode 12 faces the support substrate 112, and a lower surface of each chip 11 opposite to each chip-side electrode 12 is exposed. The lower surface may be a light extraction surface. Next, as shown in FIG. 5, the chips 11 may be transferred from the support substrate 112 to a relay substrate 14 (a relay operation). FIG. 5 is a schematic cross-sectional view for describing a process of transferring the chips 11 from the support substrate 112 to the relay substrate 14. The relay substrate 14 may have the same thermal expansion coefficient as the driving substrate 20 described below in FIG. 9. In addition, the relay substrate 14 may include a material transmitting 50% or more of visible light. In addition, the visible ray transmittance may be 50% or more while a resin layer 31, for example, silicone resin (described below), is applied to the relay substrate 14.

For example, quartz glass or alkali-free glass may be used as the relay substrate 14. This allows emission states of the chips 11 to be observed during an electrical inspection of the chips 11, which will be described below.

A size of the relay substrate 14 may be greater than or equal to a size of the driving substrate 20. This is intended for the transfer of the chips 11 to the driving substrate 20 described below to be completed at once. However, the size of the relay substrate 14 is not limited thereto. For example, a size of one relay substrate 14 may be in a range of 1/10 to 1/2 of the size of the driving substrate 20. When the size of the relay substrate 14 is smaller than that of the driving substrate 20, the transfer of the chips 11 from the relay substrate 14 to the driving substrate 20 may be repeated.

When the chips 11 are transferred from the support substrate 112 to the relay substrate 14, the chips 11 are attached to the relay substrate 14 from lower surfaces of chips 11 (an attachment operation). When the chips 11 are attached to the relay substrate 14, a resin material 31, for example, silicone resin (also called silicone elastomer) may be used.

The resin material 31 may be formed by applying silicone resin, for example, polydimethylsiloxane (PDMS) resin, to the relay substrate 14 with a uniform thickness via spin coating, laminating, slit coating, or molding.

Thereafter, the relay substrate 14 and the resin material 31 may be heated and thermally cross-linked. The thermally cross-linked resin material 31 may be adjusted to have rubber hardness of about 20 Shore A to about 100 Shore A. The hardness may be adjusted by adjusting a mixing amount of a crosslinking agent and a hardening temperature. The resin material 31 having such a hardness may have rubber characteristics, and the chips 11 may be attached by using the resin material 31.

A thickness of the resin material 31 may be, for example, in a range of about 1 μm to about 1 mm, to attach the chips 11 thereto. With such a thickness, the chips 11 may be attached to the resin material 31. In addition, when the resin material 31 has a thickness of about 1 μm to about 1 mm, in a case where an LED emits light during an electrical inspection described below, light sufficient for the inspection may pass through the resin material 31.

The transfer of the chips 11 may be performed for each support substrate 112 supporting the chips 11 of each color. A stamp or laser peeling may be used for the transfer of the chips 11. Here, a stamp method will be used as an example to describe the embodiments herein.

As shown in FIG. 5, the transfer of the chips 11 may be performed by first, pressurizing each chip 11 onto the resin material 31 for each support substrate 112. Each chip 11 may be attached to the resin material 31 according to rubber characteristics of the resin material 31. In addition, in the transfer of the chips 11 on the relay substrate 14, after the chips 11 are positioned on the resin material 31, each chip 11 may be pressurized toward the relay substrate 14 to adhere to the relay substrate 14 more firmly.

Because the chips 11 are attached according to the rubber characteristics of the resin material 31 after being transferred, locations of the chips 11 may not be easily changed and the chips 11 may not fall off from the relay substrate 14 even when a surface on which the chips 11 are arranged faces downward.

Figure 6:
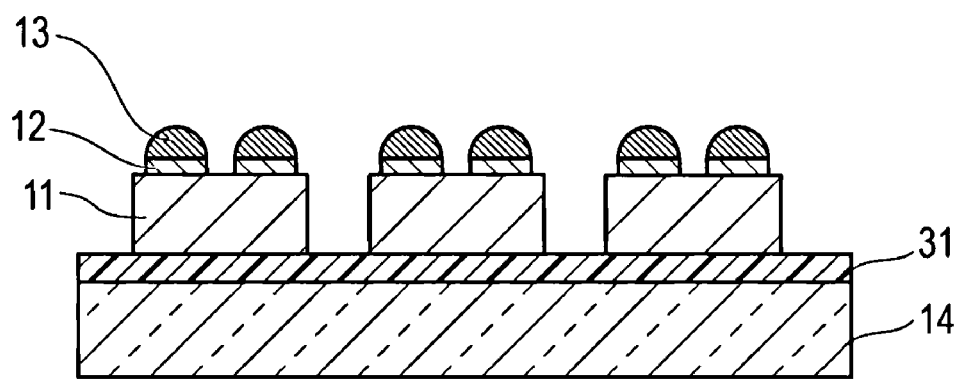
FIG. 6 is a schematic cross-sectional view illustrating a relay substrate from which a support substrate is removed according to an embodiment.

Next, the support substrate 112 may be removed from the chips 11. FIG. 6 is a schematic cross-sectional view illustrating the relay substrate 14 and the chips 11 from which the support substrate 112 removed. Removal of the support substrate 112 may be performed by using, for example, laser lift-off technique. For example, the removal of the support substrate 112 by the laser lift-off technique is performed as follows. First, a laser beam of an ultraviolet wavelength is emitted toward the support substrate 112 so as to irradiate the entire surface of the support substrate 112. For example, the laser beam used may be KrF excimer laser of a wavelength of 248 nm. The wavelength used is not limited thereto, and may be appropriately determined according to a resin material used as the resin layer 111. The resin layer 111 may be dissolved by irradiation of the laser beam, and the support substrate 112 may be separated from a surface of the chip-side electrode 12. Therefore, the support substrate 112 may be removed from the chips 11. In addition, when laser ablation is used, because the chips 11 are moved from the support substrate 112 to the relay substrate 14 by the laser ablation, a process of removing the support substrate 112 may not be necessary.

After the support substrate 112 is removed, the resin layer 111 remaining on the surface of the chip-side electrode 12 may be removed by a cleaning process. The resin layer 111 may be removed by performing the cleaning process, for example, dry etching, such as oxygen plasma washing, for a predetermined time. Alternatively, the resin layer 111 may be removed via wet etching using a chemical solution capable of dissolving the resin layer 111.

Figure 7:
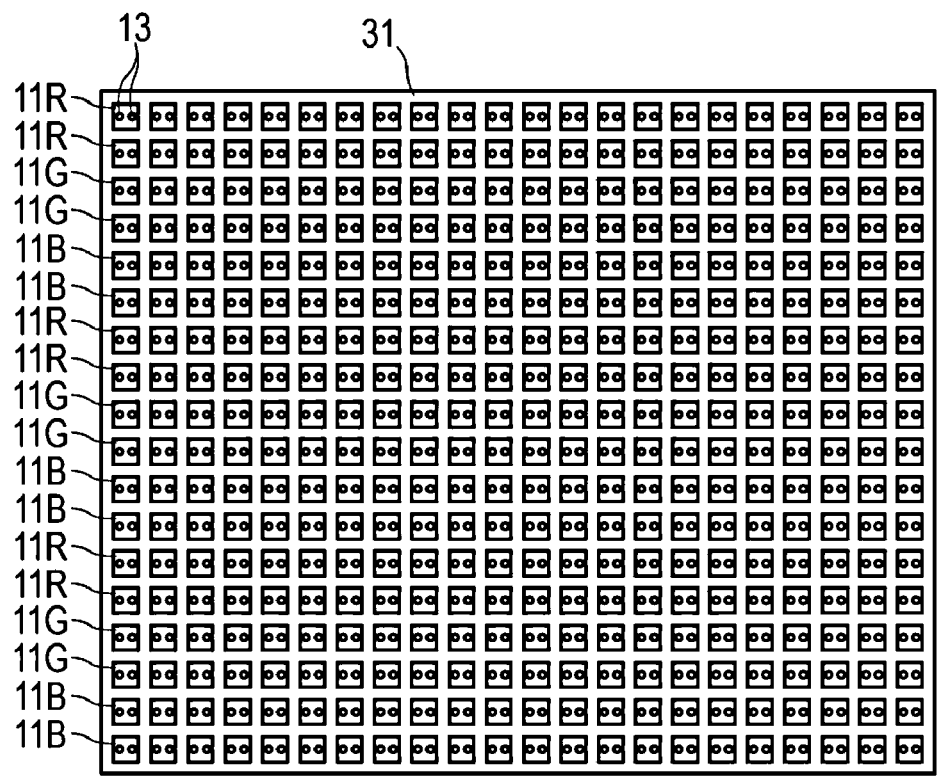
FIG. 7 is a plan view illustrating a relay substrate where chips of all colors are provided according to an embodiment.

FIG. 7 is a plan view illustrating the relay substrate 14 where the chips 11R, 11G, and 11B of all colors are supported. When the transfer of the chips 11 to the relay substrate 14 is completed, all chips 11R, 11G, and 11B of all colors may be arranged on the relay substrate 14 by the resin material 31 as shown in FIG. 7. All chips 11 may be arranged at a certain arrangement pitch. The arrangement pitch may be the same as an arrangement pitch on the driving substrate 20. In addition, the chip-side electrodes 12 and the solder 13 of the micro-bump may be exposed on the chips 11.

Figure 8:
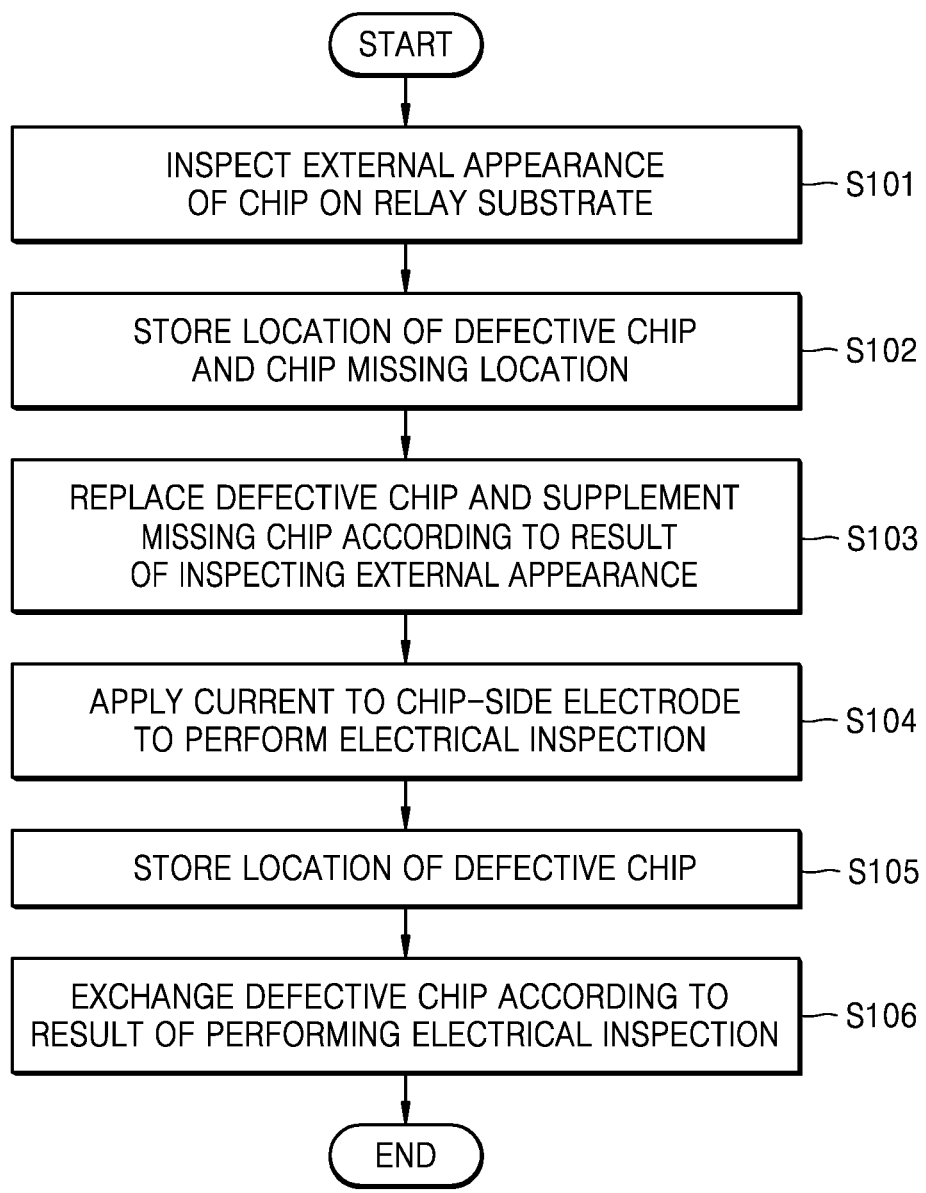
FIG. 8 is a flowchart of a method of manufacturing a display apparatus according to an embodiment.

Referring to FIG. 8, an external appearance inspection operation and an electrical inspection operation may be performed (hereinafter "an external appearance inspection" and "electrical inspection", respectively) (S101). The external appearance inspection enables detection of external appearance defects, such as an inclination of the chip 11 on the relay substrate 14, a height difference between the chips 11, missing of the chip 11, and the like, through automated optical inspection (AOI). A location of a defective chip and a chip missing location detected in the AOI may be stored in a memory device of an AOI equipment. In addition, the location of the defective chip and the chip missing location may be stored in a memory device of a computer, or the like, from which inspection information may be searched by a separate AOI equipment (S102).

Thereafter, the defective chip may be replaced with the chip 11 without any defect according to the stored location of the defective chip. A missing chip may be supplemented with a new chip 11 according to the stored chip missing location and may be attached to the relay substrate 14. In the embodiments of the disclosure, the exchange of the defective chip and the supplement of the missing chip according to a result of AOI may be referred to as a first repair operation (S103).

After the first repair operation, an electrical inspection of the chips 11 may be performed (S104). The electrical inspection is an emission test for checking whether an LED emits light satisfactorily by applying a current to each chip 11 from each chip-side electrode 12. By applying a current to each chip 11 from each chip-side electrode 12 corresponding to each chip 11, each chip 11 may emit light based on the applied current. Thereafter, the electrical inspection may be performed to determine whether emission luminance of each chip 11 is greater than or equal a certain level. The emission luminance being less than the certain level includes a case where a luminance is insufficient when light is turned on. In addition, the electrical inspection may be performed to determine whether a certain emission spectrum is satisfied. That is, if a chip being tested does not emit light greater than equal to a predetermined emission spectrum, the chip may be defective. Therefore, the chip 11 of which emission luminance is less than the certain level or that is outside the certain emission spectrum may be determined as a defective chip (or defective device). A location of the defective chip detected during the electrical inspection may be stored in a memory device of an electric device. In addition, the location of the defective chip may be stored in a memory of a computer from which inspection information may be searched by the same electrical device or a separate electrical device (S105).

In addition, the certain level of emission luminance and the certain emission spectrum are standards for light emission observed through the relay substrate 14, and may be different from standards in a final display apparatus. In addition, in the electrical inspection, it is preferable that both the emission luminance and the emission spectrum are inspected, but only one of them may be inspected.

Thereafter, the defective chip may be exchanged with a good-quality chip according to the stored location of the defective chip. In the embodiments of the disclosure, the exchange of the defective chip according to a result of the electrical inspection may be referred to as a second repair operation (S106).

For example, the electrical inspection may be performed by having an electrical inspection probe individually mounted on the chip-side electrode 12 for each chip 11, or by preparing an inspection equipment capable of simultaneously inspecting several chips 11.

Because a light-transmissive substrate is used as the relay substrate 14 as described above, when the chips 11 are turned on, light may be measured from the side of the relay substrate 14. In the electrical inspection, luminance and a wavelength of each chip 11 may be inspected at the side of the relay substrate 14.

For example, the first and second repair operations may be performed as follows. First, when a defective chip is identified on the relay substrate 14, the defective chip may be removed from the relay substrate 14 by using an adhesive stamp or the like. The adhesive stamp may be, for example, an adhesive or a needle having an adhesive property attached thereto, where the adhesive has an adhesive force stronger than the force of the resin material 31 supporting the chips 11. When the defective chip is removed, the defective chip may be glued or adhered to an end of the needle to be pulled out from the relay substrate 14. As described above, the defective chip is merely attached to the resin material 31 of the relay substrate 14, and thus the chips 11 may be easily separated individually or in a batch.

After the defective chip is removed, a good-quality chip is rearranged at the location. In addition, when chip missing is detected in the AOI, a good-quality chip may be arranged at the chip missing location.

As described above, the first and second repairs are performed to exchange or supplement the defective or missing chip with the good-quality chip on the relay substrate 14. However, the first repair operation may be omitted, and the exchange of a defective chip or the arrangement of a missing chip may be performed in an AOI by an electrical inspection, and performing repair only once after the electrical inspection. In addition, the computer may include at least one processor configured to execute the operations described above.

Figure 9:
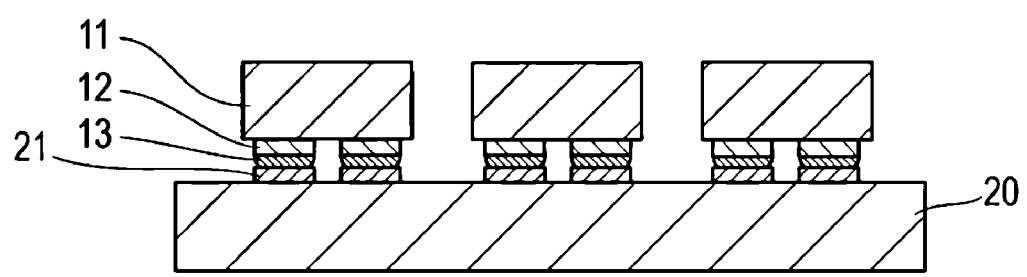
FIG. 9 is a schematic cross-sectional view for describing transfer of chips from a relay substrate to a driving substrate according to an embodiment.

FIG. 9 is a schematic cross-sectional view for describing transfer of the chips 11 from the relay substrate 14 to the driving substrate 20 according to an embodiment. Referring to FIG. 9, the chips 11 may be transferred from the relay substrate 14 to the driving substrate 20 (a bonding operation). On the driving substrate 20, an electrode to be bonded to the chip-side electrode 12 may be formed together with a wire and a thin-film transistor (TFT) required for supplying power to each chip 11 of a micro-LED. In the embodiments of the disclosure, the electrode provided on the driving substrate 20 may be referred to as a driving substrate-side electrode 21. For the driving substrate-side electrode 21, a portion of a metal wire formed on the driving substrate 20 may be used as it is, or a metal pad connected to the wire may be separately provided. The driving substrate-side electrode 21 may be formed of the same metal as the chip-side electrode 12 described above. In addition, there may be no element arranged on the driving substrate-side electrode 21. That is, the micro-bump of the solder 13 may be not formed thereon. In other words, the micro-bump of the solder 13 may not be formed between the driving substrate-side electrode 21 and the driving substrate 20.

In the transfer of the chips 11 from the relay substrate 14 to the driving substrate 20, temporary bonding may be performed without flux (a temporary bonding operation). In the temporary bonding, the relay substrate 14 and the driving substrate 20 may be polymerized such that the chip-side electrode 12 of each chip 11 attached to the relay substrate 14 contacts the driving substrate-side electrode 21 formed on the driving substrate 20. Thereafter, the relay substrate 14 and the driving substrate 20 are pressurized to approach each other, and the entire substrate may be heated at a temperature that is higher than or equal to room temperature and is lower than or equal to the solder melting temperature. Therefore, each chip-side electrode 12 may be bonded to each driving substrate-side electrode 21. Each chip-side electrode 12 may be bonded to the driving substrate-side electrode 21 with certain force even at the solder melting temperature or lower.

For example, this may be because metal atoms of Sn, which may be a main component of the solder 13, are diffusion-bonded to Au, Cu, or Al, which may be electrode materials, even when a temperature is below the solder melting temperature. According to the definition in 22702 of the JIS Standard Z3001-2, the diffusion bonding is defined as a "method in which a base material is brought into close contact and pressurized to the extent that plastic deformation does not occur as much as possible under a temperature condition below a melting point of the base material, and is bonded by using diffusion of atoms generated between bonding surfaces". Another reference is "solid-state reactive diffusion between Au and Sn" published by Kajihara's laboratory, Department of Materials Science and Engineering, Interdisciplinary Graduate School of Science and Engineering, Tokyo Institute of Technology (URL=http://j2www.materia.titech.ac.jp/kajihara/chapters/chap01/detail.html).

A heating temperature and pressurizing force may be different depending on a material of the solder 13 used in a micro-bump of the chip-side electrodes 12. For example, a melting point of SAC (96.5% of Sn, 3.0% of Ag, 0.5% of Cu) is about 217° C. to about 220° C. At the time of temporary bonding, for example, the solder 13 may be heated to a temperature of 200° C. to 216° C., and the relay substrate 14 may be pressurized onto the driving substrate-side electrode 21 with pressing force of 0.5 MPa to 1.0 MPa.

By using such ranges of temperature and pressurizing force, the chips 11 may be bonded to the driving substrate 20 without having to melt the solder 13. In addition, when the temperature is within the above-identified range for the above-identified material, the resin material 31 may not be deformed. At this operation, flux is not used to bond the chips 11 to the driving substrate 20. Therefore, flux is not provided at at least one of an interface between the chip-side electrode 12 and the solder 13 (or the metal material) or an interface between the driving substrate-side electrode 21 and the solder 13 (or the metal material). Thus, the solder 13 may be bonded to the driving substrate-side electrode 21 without any component other than metals on the interface between the solder 13 (or the metal material) of the chip-side electrode 12 and the driving substrate-side electrode 21.

Figure 10:
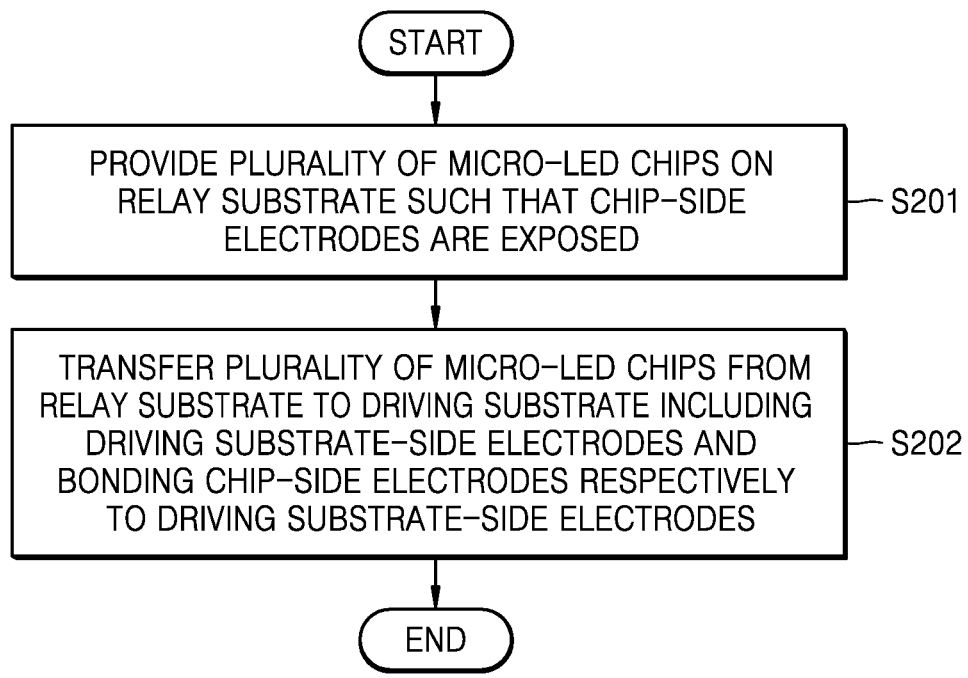
FIG. 10 is a flowchart of a method of manufacturing a display apparatus according to an embodiment.

FIG. 10 is a flowchart of a method of manufacturing the display apparatus according to an embodiment. The method of manufacturing a display apparatus may include a relay operation providing a plurality of chips 11 on the relay substrate 14 such that the chip-side electrodes 12 are exposed (S201). The chips 11 are then transferred from the relay substrate 14 to the driving substrate 20. Each chip 11 may be bonded to each driving substrate-side electrode 21 (S202). Then, the relay substrate 14 may be removed from the chips 11 (a relay substrate separation operation).

Figure 11:
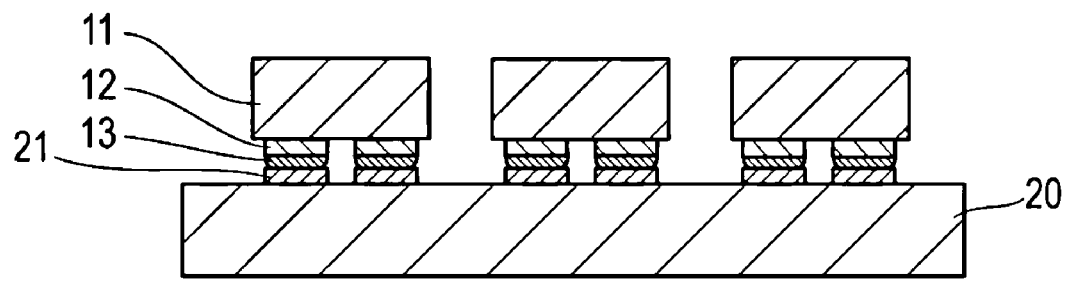
FIG. 11 is a schematic cross-sectional view illustrating a driving circuit after a relay substrate is removed from chips according to an embodiment.

FIG. 11 is a schematic cross-sectional view illustrating the driving substrate 20 after the relay substrate 14 is removed from the chips 11 according to an embodiment.

When the relay substrate 14 is removed from the chips 11, the relay substrate 14 is peeled off when pulled from the chips 11. As described above, the relay substrate 14 and the chips 11 are attached by the resin material 31. Here, the relay substrate 14 may be removed from the chips 11 when the force of the relay substrate 14 and the chips 11 being attached together by the resin material 31 is weaker than the force of the chips 11 being bonded to the driving substrate 20 via temporary bonding. Therefore, the relay substrate 14 may be easily pulled and detached from the chips 11, and as a result, the chips 11 are temporarily bonded to the driving substrate 20 as shown in FIG. 11. Thereafter, the driving substrate 20 is heated to the solder melting temperature or higher to firmly bond each chip 11 to each driving substrate-side electrode 21 (a reflow operation).

Figure 12:
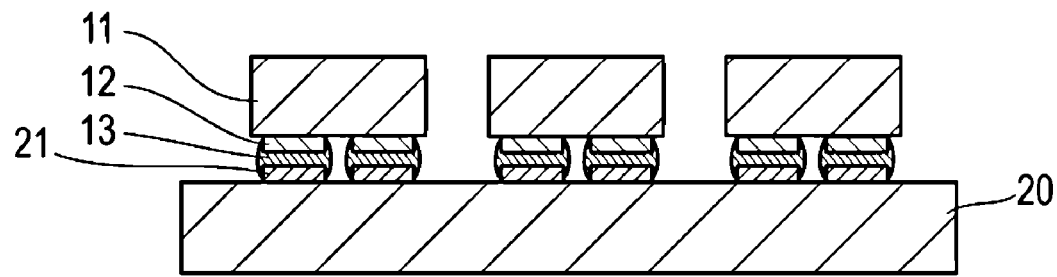
FIG. 12 is a schematic cross-sectional view illustrating a driving substrate after reflow according to an embodiment.

FIG. 12 is a schematic cross-sectional view illustrating the driving substrate 20 after reflow according to an embodiment.

In the reflow operation, before heating is performed, flux is applied to a surface of the driving substrate 20 on which the chips 11 are mounted (a flux application operation). In the reflow operation, an interface between the solder 13 and the driving substrate-side electrode 21 may be already bonded. Therefore, the applied flux may not penetrate into the interface between the solder 13 and the driving substrate-side electrode 21. When the reflow is performed in this state, as shown in FIG. 12, the chip 11 may be mounted in a well-aligned state due to a self-alignment effect when the solder 13 is melted and then solidified (process-metalized). In addition, according to this embodiment, because the flux is applied and then the reflow is performed, the solder 13 may surround an electrode slightly protruding from the surface of the driving substrate 20, such that the chip-side electrode 12 may be bonded to the driving substrate-side electrode 21 more firmly.

As such, the solder 13 which is a micro-bump formed on the chip-side electrode 12 may be firmly bonded to the driving substrate-side electrode 21 with eutectic metal through the reflow. Further, when the solder 13 (or the metal material) is provided between the chip-side electrode 12 and the driving substrate-side electrode 21, the chip-side electrode 12 may be bonded to the driving substrate-side electrode 21 without a component of flux. Flux may not be present at at least one of an interface between the chip-side electrode 12 and the metal material 13 or an interface between the driving substrate-side electrode 21 and the metal material 13. Here, the metal material may represent a material between the chip-side electrode 12 and the driving substrate-side electrode 21 when the chip-side electrode 12 and the driving substrate-side electrode 21 are reflowed through the solder 13. Therefore, the metal material is denoted by the same reference numeral 13 as the solder.

The metal material may include at least one of eutectic metal between the solder 13 and the chip-side electrode 12 or eutectic metal between the solder 13 and the driving substrate-side electrode 21. When a size of the relay substrate 14 is smaller than a size of the driving substrate 20, all chips 11 may be transferred from the relay substrate 14 to the driving substrate 20 via temporary bonding. Thereafter, the reflow may be performed on the entire driving substrate 20.

In addition, in the reflow operation, the reflow may be performed without applying flux. Even when the flux is not applied, the solder 13 may be firmly bonded to the driving substrate-side electrode 21 through eutectic metallization by being heated to the melting point or higher of the solder 13. Hereinafter, an electrode bonding operation according to an embodiment will be described.

Figure 13:
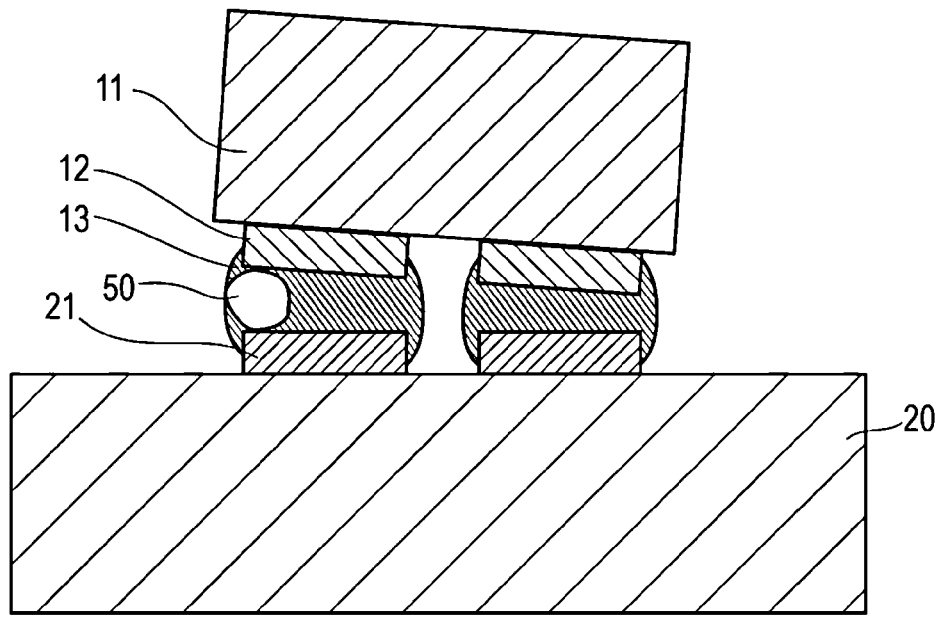
FIG. 13 is a schematic enlarged cross-sectional view illustrating a state of a defective chip bonding portion according to a comparative example.
Figure 14:
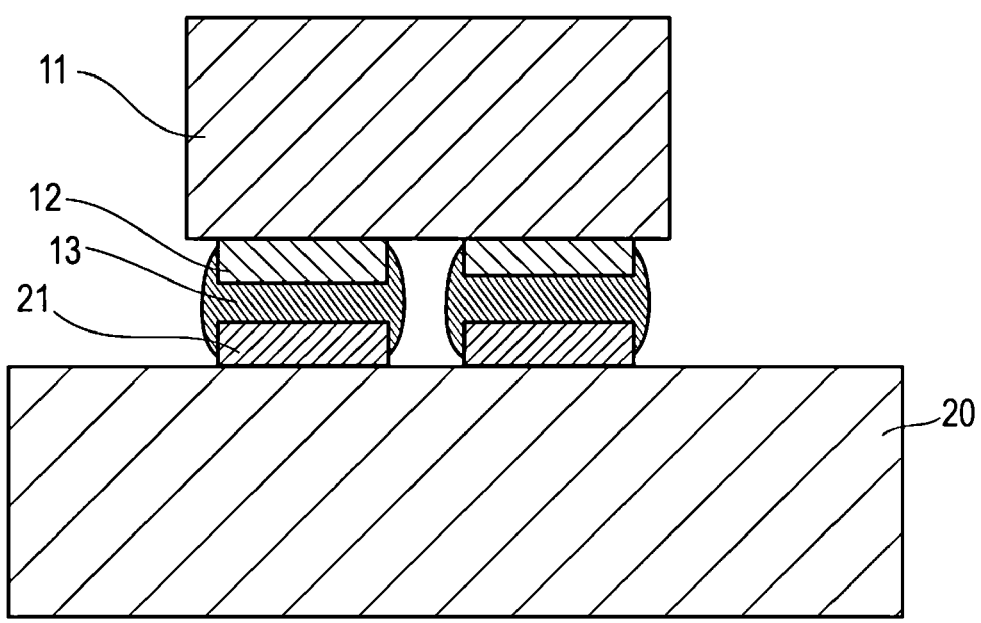
FIG. 14 is a schematic enlarged cross-sectional view illustrating a state of a chip bonding portion after reflow, according to an embodiment.

FIGS. 13 and 14 are schematic enlarged cross-sectional views illustrating a state of a chip bonding portion after reflow. FIG. 13 is a schematic enlarged cross-sectional view illustrating a defective bonding state of a chip before reflow according to a comparative example, and FIG. 14 is a schematic enlarged cross-sectional view of a bonding state of a chip after the reflow according to an embodiment.

In a bonding process of the comparative example, flux is applied to the surface of the driving substrate-side electrode 21 before the reflow. Accordingly, in an existing bonding process, when a micro-bump solder 13 of the chip-side electrode 12 is brought into contact with the driving substrate-side electrode 21, a component of flux may exist at an interface between the solder 13 and the driving substrate-side electrode 21. Therefore, in the existing bonding process, when reflow-heated in this state, as shown in FIG. 13, the component of flux expands near the interface, thereby generating a void 50. The generation of the void 50 may cause a defect such as the inclined chip 11. In particular, because the chip 11 is very small as a micro-LED, the chip 11 may fall off due to the generation of the void 50.

Conversely, according to an embodiment of the disclosure, because the solder 13 is temporarily bonded to the driving substrate-side electrode 21 before the reflow and metals are completely adhered with each other, the flux may not penetrate into a bonding interface. Therefore, the solder 13 is crystallized together with metals of the driving substrate-side electrode 21 during the reflow. In addition, in the embodiment of the disclosure, as shown in FIG. 14 compared to FIG. 13, by the reflow, the void 50 is not generated due to the component of flux. Therefore, the chip 11 is not inclined or does not fall off in the reflow operation.

Herein, a repair operation according to an embodiment will be described.

In the comparative example shown in FIG. 13, a repair on the driving substrate 20 is performed after the driving substrate 20 and the chip 11 are fixed by the solder 13. In this case, because the driving substrate 20 is firmly coupled to the chip 11, it is not easy to remove a defective chip from the driving substrate 20. For example, in a case where the defective chip is to be separated from the driving substrate 20, the driving substrate 20 may be damaged when excessive force is applied thereto. In addition, when the defective chip is separated by melting the solder 13, it is difficult to locally heat only the defective chip, and the fixed solder 13 of a good-quality chip therearound may be melted or loosened. That is, other chips around the defective chip may also fall off or move.

According to an embodiment, referring to FIG. 6, the defective chip may be separated while the chip 11 is attached to the relay substrate 14. Here, the chip 11 is attached thereto by using PDMS resin 31 formed on the relay substrate 14. Therefore, force of pulling out a defective chip from the relay substrate 14 is weaker than force of pulling out a defective chip from the driving substrate 20 in the comparative example shown in FIG. 13. In addition, in the embodiments, heating at a high temperature such as the solder melting point is not required. Therefore, only the defective chip may be easily separated from the relay substrate 14 without affecting good-quality chips around the defective chip. Therefore, repairing on the relay substrate 14 according to the present embodiment may be easier than repairing on the driving substrate 20 according to the comparative example.

An AOI, an electrical inspection, and continuous repairs may be repeatedly performed. Such repetition may be performed until the number of defective chips on the relay substrate 14 is less than the predetermined number of defective product of certain types. The defective product type may be determined based on, for example, the number of allowed defective pixels having a lighting-up problem, insufficient luminance, or the like, when a final display apparatus is completed.

Hereinafter, the manufacturing of a display in which micro-LEDs are implemented on the driving substrate 20 according to an embodiment will be described.

According to the embodiments, a plurality of micro-LEDs are collectively mounted on the driving substrate 20 formed of an alkali-free glass substrate. In a practical production process, a size of the driving substrate 20 may correspond to a size of the display, and the number of pixels may correspond to a resolution of the display. In the following description, embodiments of the disclosure will be described with reference to an experiment. For example, the size of the driving substrate 20 may be 35×35 mm, and the number of pixels (that is, the number of chips) may be 80×80×RGB. A TFT wire and a Cu electrode pad may be formed on the driving substrate 20. Here, the electrode pad corresponds to a driving substrate-side electrode 21. The electrode pads may be formed only by the number of electrode pads corresponding to the number of pixels, that is, the number of bonded chips 11.

Furthermore, as an example, an alkali-free glass substrate having a thickness of 0.7 mm and the same area size as the driving substrate 20 may be used as the relay substrate 14. The PDMS resin 31 may be formed on the relay substrate 14 with a thickness of 10 μm.

The PDMS resin 31 may be formed by applying the PDMS resin 31 on a surface of the relay substrate 14 with a uniform thickness via laminate coating, and heating the PDMS resin 31 in an oven at a temperature of 100° C. for about an hour to thermally crosslink the PDMS resin 31. Here, the finished hardness of the PDMS resin 31 may be adjusted by, for example, blending Shin-Etsu silicone SIM 360 and CAT360 manufactured by Shin-etsu Chemical Co., Ltd. Based on the above-described experimental testing, the finished hardness (after thermal crosslinking) may be about 60 Shore A in rubber hardness.

Furthermore, the chip 11 may be diced from the sapphire substrate 101 having the semiconductor layer 102 formed thereon, transferred to the support substrate 112, and then transferred to the relay substrate 14. In addition, the chip-side electrode 12 may be formed on the chip 11, and the micro-bump by the solder 13 having a height of 5 μm may be formed on the chip-side electrode 12. In addition, SAC may be used as the solder 13.

In the transfer to the relay substrate 14, the chips 11 may be arranged on the relay substrate 14 at a pitch of pixels, which are to be a final product, by using a stamp. The chip 11 and the chip-side electrode 12 may be exposed when arranged on the relay substrate 14.

Thereafter, any resin residues remaining on the chip 11 and the chip-side electrode 12 of the relay substrate 14 may be removed by, for example, applying an oxygen asher, argon (Ar) plasma treatment.

Next, defects in external appearance, such as inclination of the chip 11 on the relay substrate 14, height disparity between the chips 11 on the relay substrate 14, and the absence of the chip 11, may be detected through an AOI, and a defective chip or a missing chip may be exchanged with or rearranged with a new chip.

Next, a probe may be used to contact with the chip-side electrode 12 of the relay substrate 14 to perform an electrical inspection, and a defective chip having a lighting-up defect or a chip having a luminance or emission spectrum that does not satisfy the standard may be replaced and rearranged.

The AOI, a first repair, an electrical inspection, and a second repair may be repeatedly performed several times to remove all defective chips on the relay substrate 14 and replace with good-quality chips, such that all chips on the relay substrate 14 are good-quality chips. That is, after the repairs, the chips 11 may be accurately arranged on the relay substrate 14 and may be only good-quality chips without a single chip that does not light up.

Both the first repair and the second repair may be easily performed without requiring large force to draw out a defective chip from the relay substrate 14. In addition, a good-quality chip for exchange may be easily attached to the PDMS resin 31 of the relay substrate 14.

Next, after the driving substrate 20 and the relay substrate 14 are aligned, batch bonding may be performed at a temperature lower than or equal to a solder melting temperature at a location where electrodes overlap one another. Therefore, the chip-side electrode 12 may be temporarily bonded to the driving substrate-side electrode 21 by the solder 13.

Next, the relay substrate 14 may be peeled off and removed. All chips 11 may be bonded to the driving substrate 20, leaving no chip on the relay substrate 14. According to the experimental test described above, any absence of a chip on the driving substrate was not detected.

Next, an electrical inspection may be performed through the driving substrate 20. Although a slightly defective chip may be detected, it may be easily exchanged according to the embodiments of the disclosure. According to the above-described embodiment, because the defective chip is temporarily bonded in this operation, the defective chip may be easily removed when heated to a temperature lower than the melting point of the solder 13. In addition, a good-quality chip to be replaced may be temporarily bonded while a location on which the good-quality chip is to be mounted is locally heated at the temperature lower than the melting point of the solder 13. Therefore, the defective chips may be replaced one by one on the driving substrate 20, and thus the defective chips may be exchanged more easily than exchanging the chips 11 bonded to the driving substrate 20 in an existing manufacturing method.

Next, flux may be applied to a surface of the driving substrate 20 on which the chips 11 are temporarily bonded, and heat treatment may be performed at the solder melting temperature or higher in a reflow oven. According to an embodiment, through such reflow, the driving substrate-side electrode 21 may be firmly bonded to the solder 13, which is a micro-bump formed on the chip-side electrode 12, with eutectic metal. In addition, when the reflowed solder 13 is melted and then process-metalized, the chips 11 may be mounted in a well-aligned state according to a self-alignment effect.

A defective rate (the number of defective chips/the total number of chips) according to the experiment described above is about 0.1% (2/19,200).

For comparison, a display apparatus was manufactured via a manufacturing method without applying the manufacturing method according to the embodiments of the disclosure (a comparative example).

In the comparative example, a relay substrate, a driving substrate, and the number of chips, and micro-LED chip are the same as those in the embodiment of the disclosure. In the comparative example, the micro-LED chip is bonded to the relay substrate by using epoxy resin. Thereafter, in the comparative example, after flux is applied to the relay substrate without performing repair on the relay substrate, the chip is arranged on the driving substrate, and reflow is performed at a temperature suitable for bonding, which is higher than or equal to the melting point of the solder, without temporary bonding. When the chip is transferred from the relay substrate to the driving substrate, the chip is separated from the epoxy resin via laser lift-off. Therefore, in the comparative example, the relay substrate applied with silicone resin is not used, and repair on the relay substrate is not performed.

In the comparative example, a defective rate is about 0.8% (154/19,200). When the defective rate of 0.8% is applied to 4K pixels (3,840×2,160×RGB), the defective rate corresponds to 199,065 defective chips, and repairing all of these defective chips is not realistic because a tremendous amount of time may be consumed.

According to the embodiments of the disclosure, the number of defective chips detected on the driving substrate 20 after completion is much smaller than the number of defective chips detected in the manufacturing method of the comparative example, and thus, the embodiment of the disclosure may manufacture a higher-quality display apparatus more efficiently.

According to the embodiment of the disclosure described above, the following effects may be obtained.

In one or more embodiments of the disclosure, the chip-side electrode 12 is bonded to the driving substrate-side electrode 21 without flux. Therefore, an interface between the solder 13 of the chip-side electrode 12 and the driving substrate-side electrode 21 does not include any component other than metals. In the display apparatus according to the one or more embodiments, fewer voids 50 are generated at a bonding interface of the chips 11. In the method of manufacturing a display apparatus according to the one or more embodiments, bonding defects of the chips 11 on the driving substrate 20 are significantly reduced. According to the one or more embodiments, the exchange of defective chips on the driving substrate 20 may be reduced, and a reduction in yield may be prevented.

In addition, in the one or more embodiments, because voids are reduced at a chip bonding portion, a stable micro-LED module (display apparatus) may be manufactured. The display apparatus according to the one or more embodiments of the disclosure may be suitable for uses requiring high durability and reliability, such as sign boards which may be installed outdoors, vehicle displays enduring increased vibration, and the like, and may provide a variety of display products.

In addition, in the one or more embodiments, the chips 11 are aligned on the relay substrate 14 by using silicone resin, and an external appearance inspection and an electrical inspection are performed on the relay substrate 14 to repair a defective chip. Accordingly, the defective chip may be easily replaced when compared with repair performed after a driving substrate is mounted. Therefore, the yield of mounting the chips 11 on the driving substrate 20 may be improved.

Although the one or more embodiments of the disclosure have been described above, various modifications may be made without departing from the spirt of the embodiments of the disclosure.

In the embodiments of the disclosure described above, the chip 11 is bonded to the driving substrate 20 by directly bonding the driving substrate-side electrode 21 to the chip-side electrode 12 having a micro-bump formed by the solder 13. However, the bonding between the chip 11 and the driving substrate 20 is not limited thereto. For example, the chip 11 may be bonded to the driving substrate 20 by laminating a surface of the driving substrate 20, on which an electrode is provided, by using an anisotropic conductive film (ACF) or a non-conductive film (NCF).

As described above, because repair of the relay substrate 14 is performed even in the bonding using the ACF or the NCF, chip defects after the chip 11 is bonded to the driving substrate 20 may be reduced.

In addition, after an inspection and repair are performed on the relay substrate 14, flux may be applied to the driving substrate 20, and the chip 11 may be transferred, and then heated and solder-reflowed to be bonded. In this case, there is an advantage of a process of transferring chips at room temperature. Even in this case, because the inspection and the repair are performed on the relay substrate 14, chip defects after the chip 11 is bonded to the driving substrate 20 may be reduced.

In addition, according to the embodiments, there is provided a structure for manufacturing a display apparatus, in which a resin material (e.g., a silicone resin such as a PDMS resin, etc.) is formed on a substrate that is to be a relay substrate and various micro-light-emitting devices are attached to the resin material. As described above, in the structure for manufacturing a display apparatus, a plurality of chips 11 are arranged on a relay substrate 14 at a predetermined arrangement pitch. In the structure for manufacturing a display apparatus, a number of chips 11 to be used in the display apparatus may be accurately arranged on the relay substrate 14, and may reduce defective chips with insufficient luminance or light emitting spectrum.

In the method of manufacturing a display apparatus according to the embodiments of the disclosure, the chip 11 may be transferred from the relay substrate 14 to the driving substrate 20 to bond the chip-side electrode 12 to the driving substrate-side electrode 21. Therefore, the chip-side electrode 12 may be bonded to the driving substrate-side electrode 21 by using a metal component, and the number of voids 50 generated at an interface between electrodes may be reduced. In the method of manufacturing a display apparatus according to an embodiment of the disclosure, a defective chip on the relay substrate 14 may be easily replaced, a defective rate of chips 11 on the driving substrate 20 may be reduced, and the number of exchange of a defective chip after the chip 11 is bonded to the driving substrate 20 may be reduced.

The embodiments of the disclosure are not intended to limit the scope of the disclosure, and may be variously modified by a person having ordinary skill in the art without departing from the spirit of the disclosure. Accordingly, the scope of the disclosure should be construed based on the following claims, and it may be construed that all modifications, replacements, or equivalents thereof may fall within the scope of the disclosure.

What is claimed is:

1. A method of manufacturing a display apparatus including a plurality of micro-light-emitting diode (LED) chips each comprising a chip-side electrode, the method comprising:
   forming the plurality of micro-LED chips on a relay substrate such that the chip-side electrode is exposed;
   transferring the plurality of micro-LED chips from the relay substrate to a driving substrate comprising a driving substrate-side electrode; and
   bonding the chip-side electrode to the driving substrate-side electrode,
   wherein the bonding the chip-side electrode comprises:
      positioning the chip-side electrode and the driving substrate-side electrode to face each other,
      pressurizing the relay substrate and the driving substrate toward each other with a solder without flux being disposed between the chip-side electrode and the driving substrate-side electrode, and
      heating the chip-side electrode and the driving substrate-side electrode to a temperature lower than or equal to a solder melting temperature and compressing the chip-side electrode and the driving substrate-side electrode via the solder,
   wherein the method further comprises separating the relay substrate from the plurality of micro-LED chips; and heating the driving substrate onto which each of the plurality of micro-LED chips is compressed to a temperature equal to or higher than the solder melting temperature for reflow, and
   wherein at least one of eutectic metal between the solder and the chip-side electrode or eutectic metal between the solder and the driving substrate-side electrode is formed by the reflow.

2. The method of claim 1, wherein the forming the plurality of micro-LED chips on the relay substrate further comprises attaching the plurality of micro-LED chips with a resin material formed on the relay substrate.

3. The method of claim 2, wherein the resin material comprises silicone resin.

4. The method of claim 1, further comprising, after the forming of the plurality of micro-LED chips, applying a current to the chip-side electrode of each of the plurality of micro-LED chips formed on the relay substrate to detect a defective chip, and storing a location of the defective chip.

5. The method of claim 4, further comprising separating the defective chip from the relay substrate according to the location of the defective chip and attaching a new micro-LED chip to the location of the defective chip on the relay substrate, from which the defective chip is separated.

6. The method of claim 4, wherein the detecting the defective chip further comprises:
   determining luminance value of each of the plurality of micro-LED chips based on the current applied to the chip-side electrode of each of the plurality of micro-LED chips, and
   based on determining that the luminance value of one of the plurality of micro-LED chips is less than a predetermined luminance value, determining that the one of the plurality of micro-LED chips is defective.

7. The method of claim 4, wherein the detecting the defective chip further comprises:
   determining at least one of an inclination of a micro-LED chip, a height difference of the micro-LED chip, or a presence of the micro-LED chip on the relay substrate.

8. The method of claim 1, further comprising:
   forming, on a substrate, a semiconductor layer on which the plurality of micro-LED chips are to be formed;
   forming the chip-side electrode on the semiconductor layer;
   dividing the semiconductor layer to be the plurality of micro-LED chips; and
   transferring the plurality of micro-LED chips to a support substrate.

9. The method of claim 8, wherein the transferring the plurality of micro-LED chips comprises arranging the plurality of micro-LED chips on the support substrate at a predetermined arrangement pitch while the chip-side electrode is facing the support substrate.

10. The method of claim 8, wherein the forming the plurality of micro-LED chips further comprises, transferring the plurality of micro-LED chips on the support substrate to the relay substrate such that the chip-side electrode is exposed.

11. The method of claim 1, further comprising, after the separating of the relay substrate, applying flux to a surface of the driving substrate on which the plurality of micro-LED chips are located.

12. The method of claim 1, wherein the pressurizing and the heating further comprises heating the solder to a temperature of 200° C. to 216° C., and pressurizing the relay substrate onto the driving substrate-side electrode with a pressurizing force of 0.5 MPa to 1.0 MPa.

13. The method of claim 1, wherein the relay substrate comprises a material transmitting greater than or equal to 50% of visible light.

* * * * *